(12) United States Patent
Jovet et al.

(10) Patent No.: US 12,495,517 B2
(45) Date of Patent: Dec. 9, 2025

(54) DEVICE FOR THERMAL REGULATION OF AT LEAST ONE ELECTRONIC COMPONENT

(71) Applicant: VALEO SYSTEMES THERMIQUES, La Verriere (FR)

(72) Inventors: Bastien Jovet, La Verriere (FR); Mohamed Ibrahimi, La Verriere (FR); Thibaut Perrin, La Verriere (FR)

(73) Assignee: VALEO SYSTEMES THERMIQUES, La Verriere (FR)

(*) Notice: Subject to any disclaimer, the term of this patent is extended or adjusted under 35 U.S.C. 154(b) by 468 days.

(21) Appl. No.: 17/912,430

(22) PCT Filed: Mar. 18, 2021

(86) PCT No.: PCT/EP2021/057004
§ 371 (c)(1),
(2) Date: Sep. 16, 2022

(87) PCT Pub. No.: WO2021/185992
PCT Pub. Date: Sep. 23, 2021

(65) Prior Publication Data
US 2023/0127378 A1    Apr. 27, 2023

(30) Foreign Application Priority Data
Mar. 20, 2020   (FR) ...................................... 2002732

(51) Int. Cl.
*H05K 7/20* (2006.01)
*H01L 23/473* (2006.01)

(52) U.S. Cl.
CPC ....... *H05K 7/20272* (2013.01); *H01L 23/473* (2013.01)

(58) Field of Classification Search
CPC ........................... H01L 23/473; H05K 7/20272
See application file for complete search history.

(56) References Cited

U.S. PATENT DOCUMENTS 4,631,573 A * 12/1986 Sutrina ................. H01L 25/117
257/E23.098
5,106,129 A * 4/1992 Camacho .............. F16L 27/026
285/233
(Continued)

FOREIGN PATENT DOCUMENTS

CN          1620588 A      5/2005
CN        106403691 A      2/2017
(Continued)

OTHER PUBLICATIONS

European Patent Office, International Search Report (with English translation) and Written Opinion of corresponding International Application No. PCT/EP2021/057004, dated May 27, 2021.
(Continued)

*Primary Examiner* — Eric S Ruppert
(74) *Attorney, Agent, or Firm* — Osha Bergman Watanabe & Burton LLP

(57) ABSTRACT

The invention relates to a device for thermal regulation of at least one electronic component, including at least two circulation conduits of a heat transfer fluid, arranged along a stacking axis, and at least one heat transfer fluid manifold in fluidic communication with the circulation conduits. The heat transfer fluid manifold includes at least two fluidic connection portions, respectively assembled at one end of a corresponding circulation conduit and having, respectively, at least one collar bordering an orifice, and at least one hollow connector interposed between two fluidic connection portions along the stacking axis, and having two opposite end sections, slidably mounted inside the collars of two facing fluidic connection portions.

10 Claims, 8 Drawing Sheets

(56) References Cited

U.S. PATENT DOCUMENTS

| | | | |
|---|---|---|---|
| 6,311,768 | B1 | 11/2001 | Jamison et al. |
| 6,658,861 | B1 * | 12/2003 | Ghoshal ................ H10N 10/00 257/E23.098 |
| 6,666,263 | B2 | 12/2003 | Luz et al. |
| 10,809,007 | B2 | 10/2020 | Martinez et al. |
| 10,811,737 | B2 | 10/2020 | Palanchon |
| 2003/0121649 | A1 | 7/2003 | Seiler et al. |
| 2007/0039717 | A1 | 2/2007 | Inagaki et al. |
| 2017/0352934 | A1 | 12/2017 | Kim et al. |

FOREIGN PATENT DOCUMENTS

| | | |
|---|---|---|
| CN | 108541182 A | 9/2018 |
| CN | 109798800 A | 5/2019 |
| EP | 0631101 A1 | 12/1994 |
| EP | 1271085 A2 | 1/2003 |
| WO | 2018127639 A1 | 7/2018 |

OTHER PUBLICATIONS

China Patent Office, Office Action (with English translation) and Search Report of corresponding Chinese Application No. 202180021617.X, dated Dec. 25, 2024.

* cited by examiner

DEVICE FOR THERMAL REGULATION OF AT LEAST ONE ELECTRONIC COMPONENT

CROSS-REFERENCE TO RELATED APPLICATIONS

This application is filed under 35 U.S.C. § 371 U.S. National Phase of International Application No. PCT/EP2021/057004 filed Mar. 18, 2021 (published as WO2021185992), which claims priority benefit to French Application No. 2002732 filed on Mar. 20, 2020, the disclosures of which are herein incorporated by reference in their entirety.

TECHNICAL FIELD

The present invention relates to devices for thermally regulating electronic components, in particular those liable to release heat during operation. In particular, the invention relates to the thermal regulation of such electronic components that need to be kept within a given temperature range to obtain optimum operation and service life. This may involve electrical energy storage cells, power electronics components, integrated circuits, servers, data centers, or others, which require thermal regulation in order to keep them within their operating temperature range.

BACKGROUND OF THE INVENTION

Data centers around the world currently account for 10% of global electricity consumption. On account of the growth in information transmission and storage technology using blockchains and the advent of 5G telecommunications technology, this percentage could increase drastically in the coming years. At least half of this consumption comes from the cooling systems of these data centers. Currently, most data centers are air-cooled by cooling the ambient air in storage rooms with air conditioning devices. The optimum operating temperature for the data centers is between 5° C. and 40° C., more particularly around 27° C.

The invention can also be applied in the automotive field. The invention is advantageously applicable in the field of the thermal regulation of electrical energy storage elements, such as batteries of electric and/or hybrid motor vehicles. The electrical energy for electric and/or hybrid vehicles is supplied by one or more batteries. During operation, electrical energy storage elements such as batteries are caused to heat up and thus risk being damaged. High-density energy storage cells, such as Li-ion or Li-polymer batteries ideally need to operate within a temperature range between 20° C. and 40° C.

A charging technique, referred to as rapid charging, has recently been developed. It consists in charging the energy storage elements at a high voltage and amperage, over a short time, in particular a maximum time of about twenty minutes. This rapid charging causes a significant release of heat from the electrical energy storage elements, something that needs to be managed.

For the thermal regulation, in particular cooling, of electrical energy storage elements, such as batteries, it is known practice to use a thermal regulation device.

In one known solution, the thermal regulation device has plates, for example cooling plates incorporating circulation channels for a heat transfer fluid, such as a coolant liquid, arranged between the electrical energy storage elements. These plates are brazed together and, if appropriate, also brazed to coolant liquid inlet and outlet manifolds. In particular, during assembly, such electrical energy storage elements for example and the pairs of plates are stacked successively.

However, such an assembly does not offer any mounting flexibility with regard to the insertion of the energy storage elements to be cooled in the thermal regulation device. This is because the thermal regulation device is fixed after brazing, and there is no flexibility in terms of the stacking axis. It is therefore not possible to ensure effective thermal contact between a electronic component to be thermally regulated and a plate, for example a cooling plate.

BRIEF SUMMARY OF THE INVENTION

The aim of the invention is to allow electronic components to be inserted more readily in the thermal regulation device, whilst still ensuring effective thermal regulation, such as cooling, of electronic components that are liable to release heat during operation. The invention can advantageously be used in the automotive field, for example, to thermally regulate power electronics components or electrical energy storage cells, or else in the field of data centers to regulate servers.

To that end, the invention relates to a device for thermally regulating at least one electronic component, said device having at least two circulation ducts for a heat transfer fluid which are arranged along a stacking axis, and at least one heat transfer fluid manifold in fluidic communication with the circulation ducts. According to the invention, said at least one heat transfer fluid manifold has: at least two fluidic connection portions respectively assembled at one end of a corresponding circulation duct, the fluidic connection portions respectively having at least one collar bordering an orifice, and at least one hollow connector interposed between two fluidic connection portions along the stacking axis, and having two opposite end sections mounted so as to be able to slide inside the collars of two facing fluidic connection portions.

The end sections form beads which provide the sealing function of said at least one heat transfer fluid manifold.

Moreover, since the hollow connectors are interposed between the fluidic connection portions, there is no direct mechanical connection between the circulation ducts and the hollow connectors, thereby making it possible to ensure a relative displacement between the collars and the slidingly mounted connectors. This affords flexibility, mounting tolerance in the stack direction, which make it possible to space apart the heat transfer fluid circulation ducts in order to insert the electronic components to be thermally regulated between them and then to compress the assembly when the electronic components have been inserted. The compression also ensures that effective thermal contact can be made between the circulation ducts and the interposed electronic components to be thermally regulated.

The thermal regulation device can also have one or more of the following features described below, considered separately or in combination.

According to one aspect, said at least one collar of a fluidic connection portion extends from said portion toward a neighboring fluidic connection portion along the stacking axis.

The end sections are mounted so as to be able to slide in the collars between a first position and a second position. When the end sections are in the first position, said at least one manifold is in a position of maximum extent. When the end sections are in the second position, said at least one manifold is in a position of maximum compression.

According to another aspect, said at least one hollow connector is shaped such that the end portions are always accommodated inside the collars.

The collars can respectively have a stop against which an end section of a hollow connector can butt in the first position.

Advantageously, said at least one hollow connector is shaped so as not to block the flow of the heat transfer fluid at the outlet of the circulation duct, even in the second position or position of maximum compression of said at least one heat transfer fluid manifold.

In particular, the hollow connector is shaped such that the end sections do not face the heat transfer fluid outlets of the circulation ducts in the position of maximum compression of said at least one heat transfer fluid manifold.

According to another option, the collars can have another stop against which an end section of a hollow connector can butt in the position of maximum compression of said at least one heat transfer fluid manifold.

According to yet another option, the length of said at least one hollow connector can be adapted such that the end sections cannot be arranged facing the heat transfer fluid duct outlets, in the position of maximum compression of said at least one heat transfer fluid manifold.

Said at least one hollow connector can have a cylindrical overall shape, with a central portion having a first external diameter and the end sections having a second external diameter greater than the first external diameter. The term "external" is defined in contrast to the passage for the flow of the heat transfer fluid inside the hollow connector when the heat transfer fluid manifold is assembled.

The second external diameter of the end sections is equal to or greater than the internal diameter of the collars, so as to always provide sealing.

According to yet another aspect, said device can have a predefined number of half-shells assembled in pairs at one end of an associated circulation duct, so as to define a fluidic connection portion of said at least one heat transfer fluid manifold.

Said at least one hollow connector is arranged between two pairs of half-shells.

At least one half-shell of a pair has at least one collar extending toward a half-shell of an adjacent pair along the stacking axis.

Said at least one collar is made in one piece with the half-shell.

Two facing half-shells of two adjacent pairs respectively have at least one collar, and a hollow connector is arranged between the collars of facing half-shells.

The half-shells of a pair are symmetrical about a joint plane.

According to one example, the fluidic connection portions can be made from a first material and said at least one hollow connector can comprise at least one second, compressible material. The first material has a greater stiffness than said at least one second material.

According to a first embodiment, said at least one hollow connector is arranged centrally with respect to the ends of the circulation ducts.

According to a second embodiment, said at least one hollow connector is arranged eccentrically with respect to the ends of the circulation ducts.

Said at least one hollow connector can be made by overmolding an insert.

In particular, said at least one hollow connector can comprise at least two materials. Said at least one hollow connector can comprise a material in the center, for example the material of the insert, and a material around it, for example for the overmolding. The material in the center can have a stiffness greater than the material around it, which can be of elastomer type, by way of non-limiting example ethylene-propylene-diene monomer rubber, also known as EPDM. This results in a skeleton in the center that is stiffer than the compressible external part, making it possible to avoid the hollow connector collapsing on itself.

In one option, said at least one heat transfer fluid manifold has at least one end stop for said electronic components along an axis transverse to the stacking axis.

The half-shells assembled in pairs respectively have a peripheral edge delimiting an opening into which leads the end of the associated circulation duct.

The peripheral edge can form said at least one end stop.

Said at least one heat transfer fluid manifold can be closed off on one side and attached to a heat transfer fluid circuit on the other side.

The invention furthermore relates to a battery module for a motor vehicle, having a plurality of energy storage cells and a thermal regulation device as defined above, configured to thermally regulate the energy storage cells interposed between the heat transfer fluid circulation ducts.

BRIEF DESCRIPTION OF THE DRAWINGS

Further advantages and features of the invention will become more clearly apparent from reading the following description, given by way of illustrative and non-limiting example, and the appended drawings, in which.

DETAILED DESCRIPTION OF THE INVENTION

Figure 1:
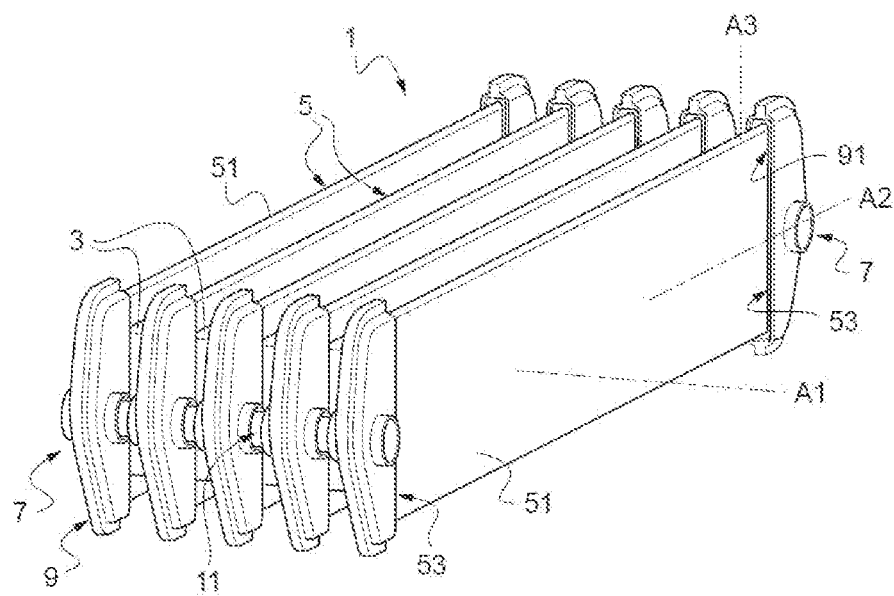
FIG. 1 is a perspective view of a thermal regulation device according to a first embodiment, assembled with electronic components.

In the figures, identical elements bear the same reference numerals.

The following embodiments are examples. Although the description refers to one or more embodiments, this does not necessarily mean that each reference relates to the same embodiment, or that the features apply only to a single embodiment. Individual features of various embodiments can also be combined or interchanged to provide other embodiments.

In the description, certain elements can be indexed, such as first element or second element, for example. In this case, this is merely indexing for differentiating and denoting elements that are similar but not identical. This indexing does not imply that one element takes priority over another and such denominations can easily be interchanged without departing from the scope of the present description. This indexing does not imply an order in time either.

Figure 2:
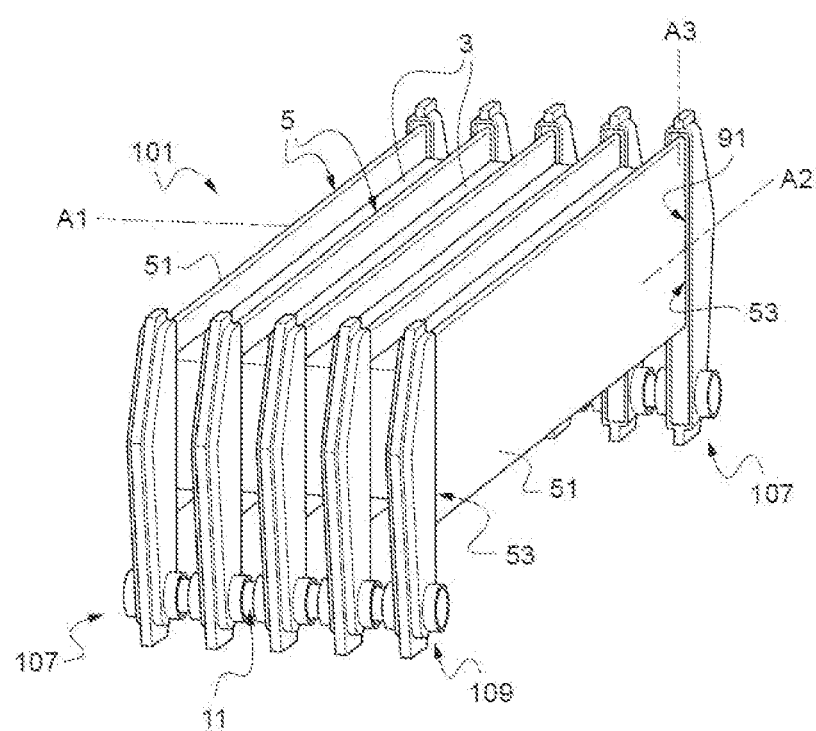
FIG. 2 is a perspective view of a thermal regulation device according to a second embodiment, assembled with electronic components.

With reference to FIGS. 1 and 2, the invention relates to a thermal regulation device 1, 101. Such a device 1, 101 is intended in particular to be fitted in a motor vehicle. The device 1, 101 can have a parallelepipedal overall shape.

The device 1, 101 is intended to accommodate electronic components 3 that are liable to release heat during operation, for the thermal regulation of the latter. Non-exhaustively, the electronic components 3, shown very schematically in the figures, can in particular be electrical energy storage elements or a power electronics device, for example in the automotive field. By way of example, they can be electrical cells making up a battery module or battery pack in an electric or hybrid vehicle.

The thermal regulation can involve the heating and/or cooling of the electronic components 3. In particular, the thermal regulation device 1, 101 is configured to provide a cooling function for the electronic components 3.

In general, the device 1, 101, has a predefined number of circulation ducts 5 for a heat transfer fluid and at least one heat transfer fluid manifold 7, 107, in fluidic communication with the circulation ducts 5. The heat transfer fluid is for example a coolant liquid. In the examples illustrated, the device 1, 101, has two heat transfer fluid manifolds 7, 107, for the entry and for the exit of heat transfer fluid.

The circulation ducts 5 are arranged along a stacking axis A1. The electronic components 3 are intended to be interposed between the circulation ducts 5, so as to form an alternating stack of circulation ducts 5 and electronic components 3 along the stacking axis A1.

The circulation ducts 5 are formed by tubes, for example, such as extruded tubes. The extruded tubes have the advantage of being able to be provided at or cut to the desired length, for example with the same length as or with a greater length than the associated electronic components 3. In addition, the number of extruded tubes can be adapted to suit the stack, thereby making it possible to have a modular thermal regulation device 1, 101.

As an alternative, the circulation ducts 5 can be formed by joining two plates, for example by brazing, delimiting between them at least one channel for the circulation of the heat transfer fluid.

The heat transfer fluid is intended to flow inside a tube or between two plates, in one or more passes, with a linear or non-linear flow pattern, for example with "I"-shaped circulation or in two passes for "U"-shaped circulation.

In the particular example illustrated in FIG. 1 or 2 of the device 1, 101, the circulation ducts 5 extend for example along a plane perpendicular to the stacking axis A1. They extend longitudinally along an axis A2 which is transverse to the stacking axis A1, and extend widthwise along an axis A3, which corresponds to a vertical axis in the disposition of the elements in FIGS. 1 and 2.

The circulation ducts 5 respectively have an external wall 51, that is to say opposite to the circulation duct 5 for the heat transfer fluid inside the circulation duct 5. This external wall 51 is intended to be arranged in thermal contact with the electronic components 3 when the device 1, 101, is mounted for example in a motor vehicle.

The external walls 51 of the circulation ducts 5 can be arranged in direct contact with a surface of the electronic component 3 or with a support of the electronic component 3. As an alternative, a thermal interface (not depicted) can be provided between each electronic component 3 and the external walls 51 of adjacent circulation ducts 5. As a variant or in addition, at least one electrical insulator (not depicted) can be provided between the electronic components 3 and the external walls 51 of adjacent components 5, in order to ensure the user's safety. The electrical insulation can be provided by a layer of paint. In a variant which is not depicted, the electrical insulator and the thermal interface can be made in one piece.

As mentioned above, the heat transfer fluid circulation ducts 5 are arranged in fluidic communication with the heat transfer fluid manifold(s) 7, 107. To this end, the circulation ducts 5 respectively have at least one fluidic connection region 53 at least at one of the heat transfer fluid manifolds 7, 107.

The heat transfer fluid manifolds 7, 107, are attached at one end, in this instance a longitudinal end, of the circulation ducts 5. In the embodiments described with two manifolds 7, 107, they are attached at opposite ends of the circulation ducts 5. In this case, the circulation ducts 5 have two fluidic connection regions 53, one at each end, in this instance longitudinal end. The fluidic connection regions 53 of the circulation ducts 5 lead into a respective one of the heat transfer fluid manifolds 7, 107.

Generally speaking, the heat transfer fluid manifolds 7, 107 extend longitudinally along the stacking axis A1.

Furthermore, the heat transfer fluid manifolds 7, 107 are closed off on one side and open on the other side, so as to be placed in fluidic communication with a heat transfer fluid circuit. According to the examples depicted in FIGS. 3 and 4, this involves sides at longitudinal ends of the heat transfer fluid manifolds 7, 107 along the stacking axis A1.

One of the heat transfer manifolds 7, 107 allows the entry E of the heat transfer fluid, for example in the cold state, and its distribution among the various circulation ducts 5, and the other ensures the return and discharge or exit S of the heat transfer fluid, for example in the hot state, after it has passed through the circulation ducts 5.

Figure 3:
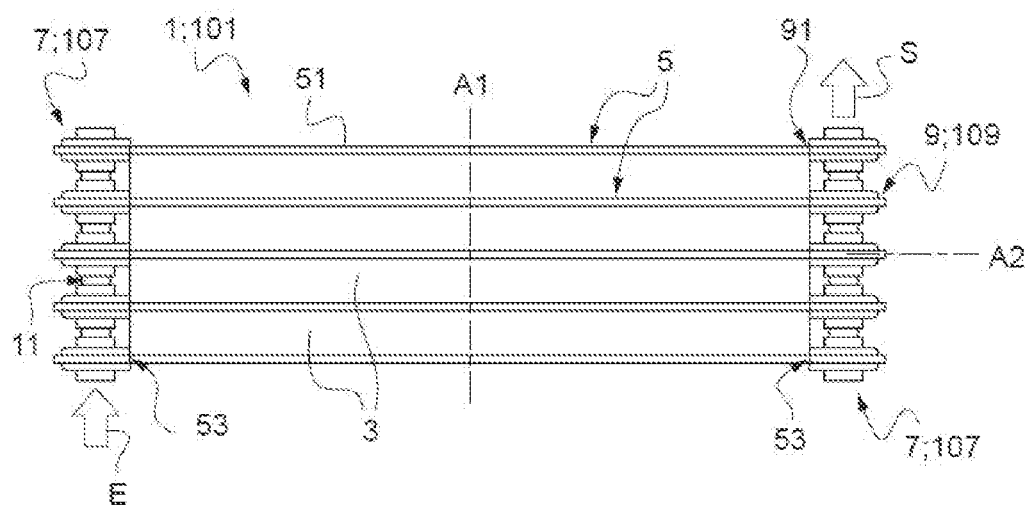
FIG. 3 is a top view of a thermal regulation device showing a first direction of flow of a heat transfer fluid within said device.
Figure 4:
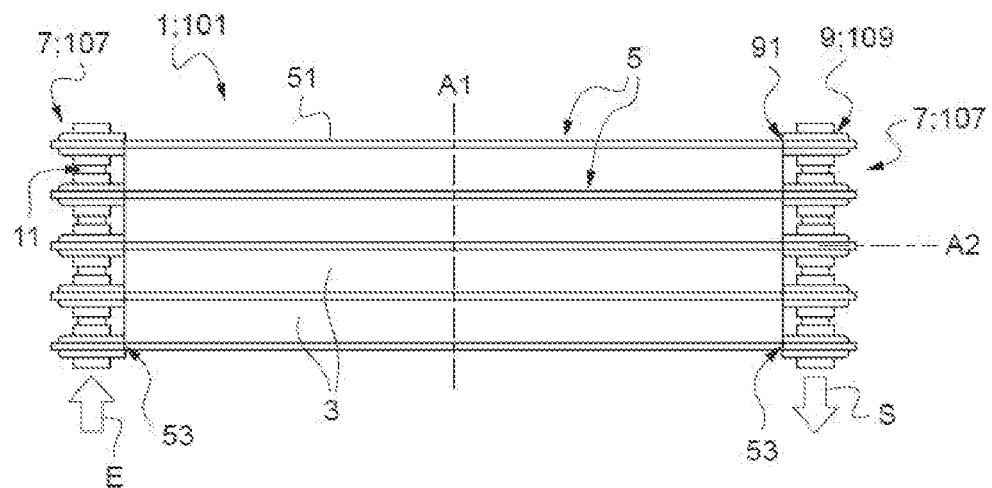
FIG. 4 is a top view of a thermal regulation device showing a second direction of flow of a heat transfer fluid within said device.

The two heat transfer fluid manifolds 7, 107 for the entry E of heat transfer fluid and the exit S of heat transfer fluid can be open and closed off at opposite ends in relation to one another, so as to allow the entry E and the exit S of the heat transfer fluid from two opposite sides of the thermal regulation device 1, 101, as is schematically shown in FIG. 3. Conversely, the two heat transfer fluid manifolds 7, 107 can be open and closed off symmetrically with respect to the stacking axis A1, so as to allow the entry E and the exit S of the heat transfer fluid from the same side of the thermal regulation device 1, 101, as is schematically shown in FIG. 4.

Optionally, the heat transfer fluid manifolds 7, 107 can optionally comprise at least one end stop for the electronic components 3. This involves in particular one or more end stops allowing the electronic components 3 to be locked in position along the transverse axis A2.

With reference to FIGS. 1 to 4, the heat transfer fluid manifolds 7, 107, have at least two fluidic connection portions 9, 109 and at least one hollow connector 11.

Each hollow connector 11 is interposed between two fluidic connection portions 9, 109 along the stacking axis A1. More generally, in the examples illustrated, the heat transfer fluid manifolds 7, 107 have an alternating succession of fluidic connection portions 9, 109 and interposed hollow connectors 11. The heat transfer fluid manifold 7, 107 advantageously has at least one sealing element between the fluidic connection portions 9, 109 and the hollow connectors 11.

The fluidic connection portions 9, 109 are arranged at the fluidic connection regions 53 of the circulation ducts 5. The fluidic connection portions 9, 109 are respectively assembled at one end, in this instance a longitudinal end along the transverse axis A2, of a corresponding circulation duct 5.

To this end, the fluidic connection portions 9, 109 respectively delimit at least one opening 91 into which the end, in this instance longitudinal end, of a corresponding circulation duct 5 leads in the assembled state of the thermal regulation device 1, 101.

Such an opening 91 is delimited by a peripheral edge which can form an end stop for the electronic components 3 along the transverse axis A2.

The dimensioning of the fluidic connection portions 9, 109 in particular takes into account internal mechanical stresses, for example from the internal pressure of the heat transfer fluid, and mechanical stresses external to the heat transfer fluid manifold 7, 107.

The fluidic connection portions 9, 109 are made from a first material. In particular, the fluidic connection portions 9, 109 can be made from a metallic material, for example aluminum or an aluminum alloy. The circulation ducts 5 and the fluidic connection portions 9, 109 can be brazed together.

With reference to FIGS. 5 to 8, the fluidic connection portions 9, 109 can for example be made in the form of half-shells 93 assembled in pairs. The two half-shells 93 of a pair are preferentially symmetrical with respect to their joint plane.

Each pair of half-shells 93 is arranged at one end of a corresponding circulation duct 5. The assembled half-shells 93 of a pair define between them the opening into which the end of a corresponding circulation duct 5 can lead. The peripheral edge of the two assembled half-shells 93 delimiting this opening can form the end stop for the electronic components 3 along the transverse axis A2.

The half-shells 93 can be formed by stamping.

The pairs of half-shells 93 are placed in fluidic communication by the interposed hollow connectors 11, thus defining a heat transfer fluid manifold 7, 107.

The fluidic connection portions 9, 109 moreover respectively have at least one collar 95 bordering an orifice 97. The collar 95 of a given fluidic connection portion 9, 109 extends from the latter toward a neighboring fluidic connection portion along the stacking axis A1. In particular, the collar 95 extends from an external surface of the given fluidic connection portion 9, 109, that is to say from the side opposite the passage for the flow of the heat transfer fluid defined inside the fluidic connection portion 9, 109.

The end fluidic connection portions 9, 109 can have a single collar 95 or two collars 95, one of which is closed off. The intermediate fluidic connection portions 9, 109 can have two collars 95 extending respectively toward a neighboring fluidic connection portion 9, 109.

In the example defined above, at least one of the half-shells 93 of a pair can have such a collar 95 bordering an orifice 97. The collar 95 can be formed integrally with the half-shell 93.

The collar 95 is oriented toward the outside of the passage for the flow of heat transfer fluid, defined between the two half-shells 93 of one and the same pair in this example. The collar 95 of one half-shell 93 extends toward a half-shell 93 of an adjacent or neighboring pair. Two facing half-shells 93 of two neighboring pairs respectively have a mutually facing collar 95.

The collar 95 of an end half-shell 93, along the stacking axis A1, can extend for example toward an attachment element (not depicted) for attachment to a heat transfer fluid circuit, such as a pipe. The half-shell 93 located at the other end of the heat transfer fluid manifold 7, 107 can be without a collar or have a closed-off collar.

The collars 95 have a complementary shape to the shape of the hollow connectors 11. The collars 95 have a cylindrical overall shape, for example. The axis of revolution of the cylindrical shape coincides with the stacking axis A1 in the assembled state of the thermal regulation device. Together, the collars 95 and of the hollow connectors 11 form a cylinder of the heat transfer fluid manifold 7, 107.

The hollow connectors 11, for their part, are realized by attachments separate from the fluidic connection portions 9, 109 for example formed by the pairs of half-shells 93. The hollow connectors 11 are in the form of sleeves, for example.

Advantageously, the hollow connectors 11 respectively have at least one sealing element.

The hollow connector 11 can comprise at least one compressible second material such as a polymer, in particular an elastomer. Such a compressible material can function as a seal. The first material of the fluidic connection portions 9, 109 has a stiffness greater than the stiffness of the second material.

The hollow connectors 11 are respectively arranged between two pairs of half-shells 93 so as to place the circulation ducts 5 in fluidic communication. In particular, the collars 95 of neighboring fluidic connection portions 9, 109, in this example facing half-shells 93 of neighboring pairs, are joined by way of the hollow connectors 11.

The hollow connectors 11 can be fitted inside the collars 95 of the fluidic connection portions 9, 109.

To this end, the hollow connectors 11 have a complementary shape to that of the collars 95, for example a cylindrical overall shape with an axis of revolution that coincides with the stacking axis A1.

Figure 6:
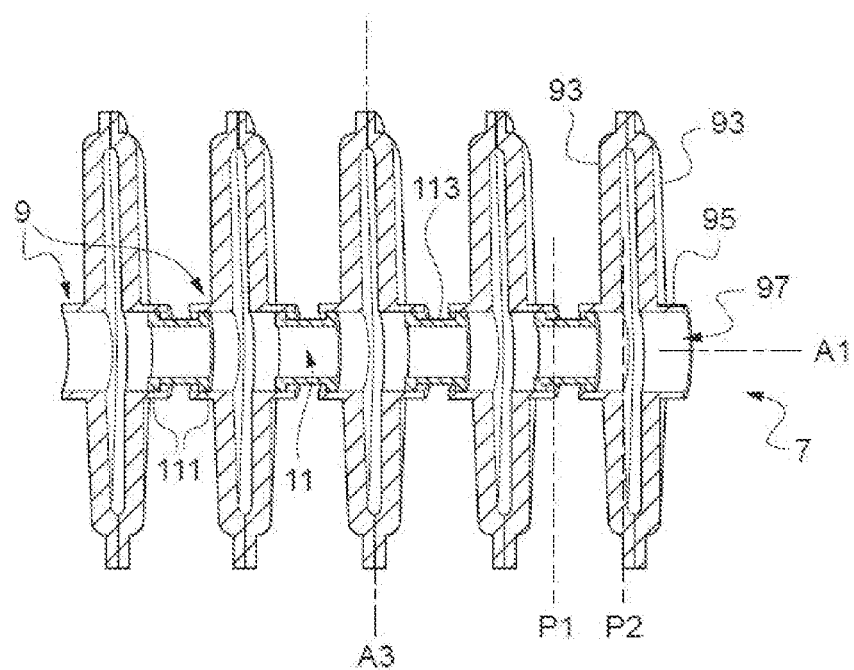
FIG. 6 is a view in section along a stacking axis of the heat transfer fluid manifold of FIG. 5.
Figure 8:
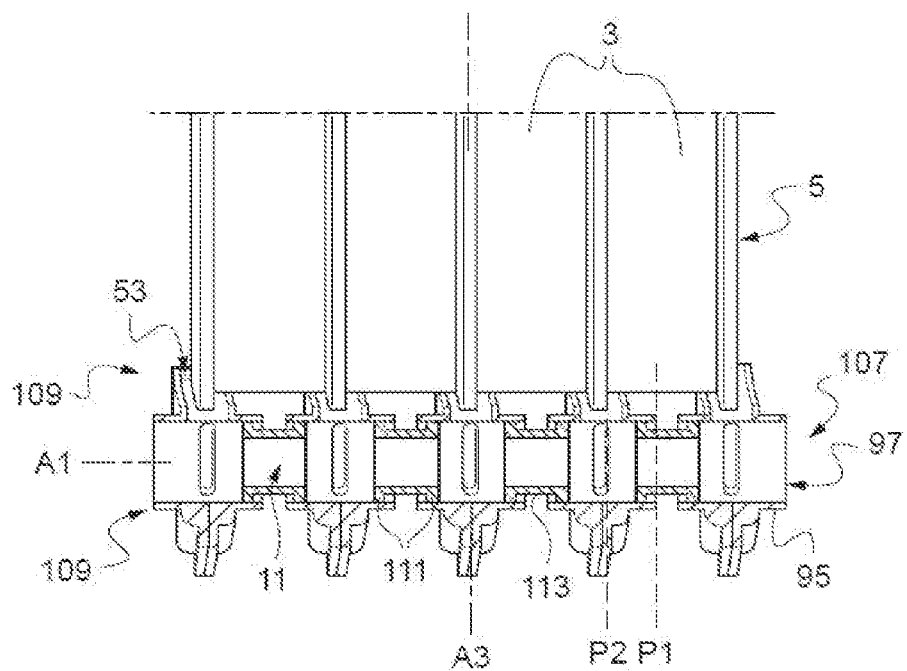
FIG. 8 is a view in section along a stacking axis of the heat transfer fluid manifold of FIG. 7.
Figure 9:
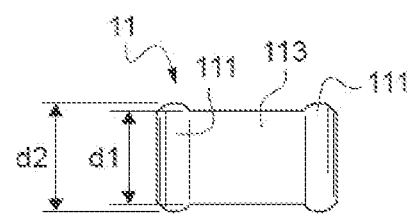
FIG. 9 shows an example of a hollow connector for a heat transfer fluid according to the first or the second embodiment.

With reference to FIGS. 6, 8, and 9, the hollow connectors 11 respectively have two opposite end sections 111, each of which is intended to be accommodated in a complementing collar 95 of a fluidic connection portion 9, 109. The end sections 111 form beads, which provide the sealing function for the heat transfer fluid manifold 7, 107. Each hollow connector 11 thus has two sealing elements for sealing each side.

These end sections 111 are located on either side of a central portion 113 along the stacking axis A1. The central portion 113 has a first external diameter d1 and the end sections 111 have a second external diameter d2 greater than the first external diameter d1. The term "external" is defined in contrast to the passage for the flow of the heat transfer fluid inside the hollow connector 11 when the heat transfer fluid manifold 7, 107 is assembled.

The second external diameter d2 of the end sections 111 is equal to or greater than the internal diameter of the collar 95 accommodating it, so as to always ensure sealing.

In addition, the end sections 111 of the hollow connectors 11 are mounted so as to be able to slide in the collars 95, such that a relative displacement between the collars 95 and the hollow connectors 11 is allowed. Such a displacement provides a mounting tolerance along the stacking axis A1. Specifically, this makes it possible to space apart or stretch out the heat transfer fluid manifold 7, 107 or, by contrast, to compress it along the stacking axis A1. This confers flexibility on the device 1, 101 along the stacking axis A1, and allows the circulation ducts 5 to be spaced apart in order to insert the electronic components 3 to be thermally regulated between them and then the stack of the circulation ducts 5 with the interposed electronic components 3 to be compressed.

More specifically, the end sections 111 are mounted so as to be able to slide between a first position delimited by way of non-limiting example by a broken line referenced P1 in FIGS. 6 and 8, and a second position delimited by way of non-limiting example by a broken line referenced P2 in FIGS. 6 and 8. These two positions P1 and P2 define terminal positions between which an end section 111 can slide.

When the end sections 111 of the hollow connectors 11 are in the first position P1, the heat transfer fluid manifold 7, 107 is in a configuration or position of maximum extent. Conversely, when the end sections 111 of the hollow connectors 11 are in the second position P2, the heat transfer fluid manifold 7, 107 is in a configuration or position of maximum compression.

The hollow connector 11 is advantageously shaped such that the end sections 111 of the hollow connector are accommodated inside the collars 95 in all of the positions.

In the first position P1, the end sections 111, in particular at the junction with the central portion 113, can bear against first stops (not depicted in the figures) provided at the collars 95. This makes it possible to prevent the end sections 111 from coming out of the collars 95 and the hollow connectors 11 from becoming detached from the fluidic connection portions 9, 109.

Moreover, the hollow connectors 11 are advantageously shaped so as not to block the flow of the heat transfer fluid at the outlet of the circulation duct 5, even in the position of maximum compression of the heat transfer fluid manifold 7, 107. In particular, the hollow connectors 11 are shaped such that their end sections 111 do not come to face the outlets of the heat transfer fluid circulation ducts 5 when the heat transfer fluid manifold 7, 107 is in the position of maximum compression.

To this end, in the second position P2, the end sections 111, in particular on the side opposite the central portion 113, can bear against second stops (not depicted in the figures) provided at the collars 95.

As an alternative or in addition, the length of the end connectors 11 can be adapted such that the end sections 111 cannot be arranged facing the heat transfer fluid outlets of the circulation ducts 5, even when the heat transfer fluid manifold 7, 107 is in the position of maximum compression.

Moreover, the hollow connectors 11 can be made by overmolding inserts. This consists in particular in overmolding two seals (formed by the end sections 111) in one piece.

The hollow connectors 11 can comprise, for example, at least two materials, the second material of which is compressible. The two materials of a hollow connector 11 can have different stiffnesses, different flexibilities.

In one non-limiting example, the hollow connectors 11 can comprise a material in the center, for example the material of the insert, surrounded by another material, such as the second, compressible material. In this example, this is material for the overmolding. The material in the center can be a third material having a stiffness greater than that of the second, compressible material around it. The latter can be of elastomer type, by way of non-limiting example ethylene-propylene-diene monomer, also known as EPDM. The insert acts as a skeleton making it possible to avoid the hollow connector 11 collapsing on itself.

Two embodiments of the heat transfer fluid manifolds 7, 107 are depicted.

Figure 5:
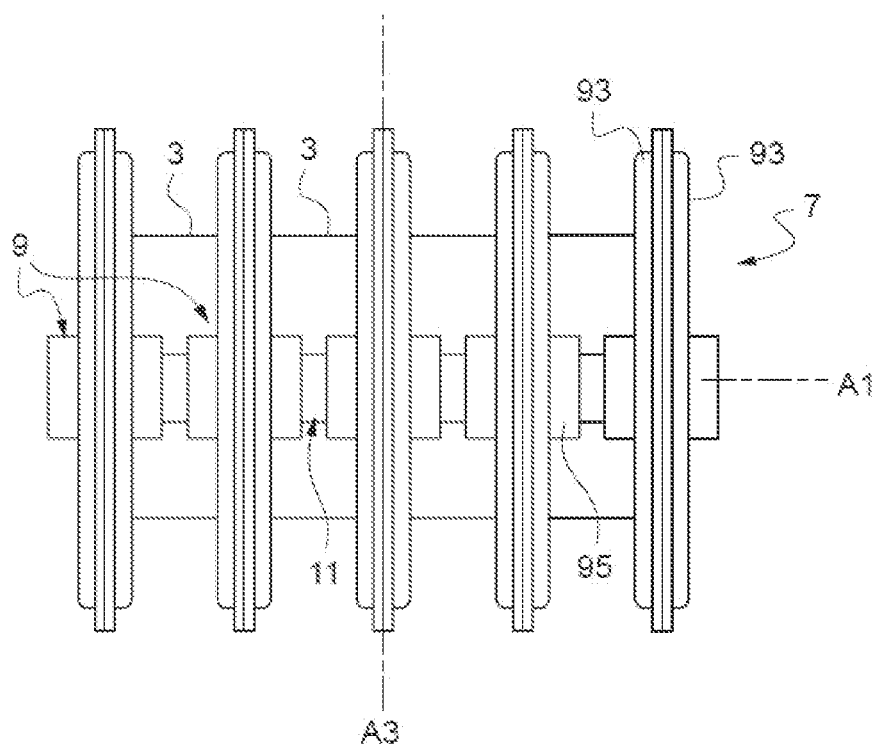
FIG. 5 is an enlarged view of the heat transfer fluid manifold of the thermal regulation device according to the first embodiment.

According to a first embodiment illustrated in FIGS. 1, 5 and 6, the hollow connectors 11 are arranged centrally with respect to the ends of the circulation ducts 5.

In addition, the fluidic connection portions 9, 109, for example in the form of pairs of half-shells 93, are centered with respect to the ends of the circulation ducts 5, in particular along the axis A3. The collars 95 can be at the center of the half-shells 93, in particular along the axis A3. In addition, the half-shells 93 can have a width along the axis A3 which can be slightly greater than the width of the longitudinal ends of the circulation ducts 5.

Figure 7:
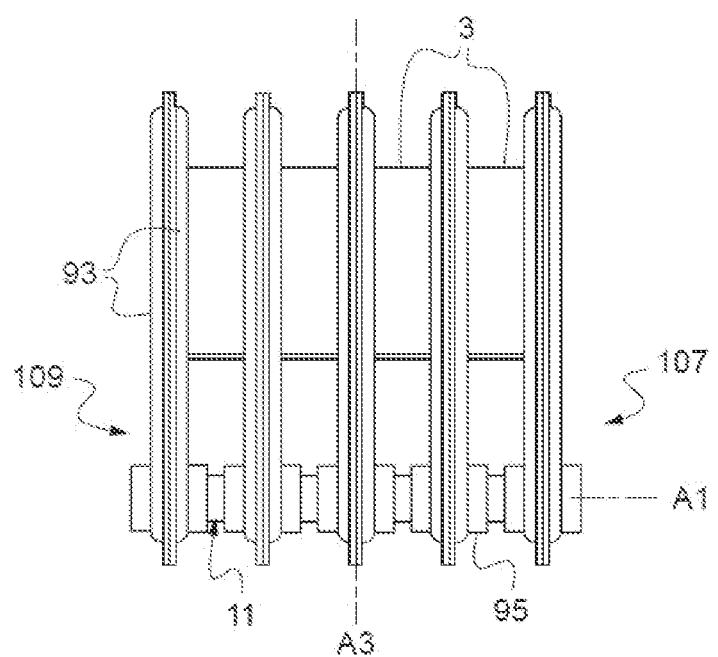
FIG. 7 is an enlarged view of the heat transfer fluid manifold of the thermal regulation device according to the second embodiment.

According to a second embodiment depicted in FIGS. 2, 7 and 8, the hollow connectors 11 are arranged eccentrically with respect to the ends of the circulation ducts 5, in particular along the axis A3. In other words, the junction region between the fluidic connection portions 9, 109 is eccentric. This mechanical junction region is located in a lower part of the thermal regulation device 1, 101 with reference to the orientation of the elements in FIGS. 2, 7 and 8.

In addition, the fluidic connection portions 9, 109, for example in the form of pairs of half-shells 93, are eccentric with respect to the ends of the circulation ducts 5. Moreover, the half-shells 93 can have a width along the axis A3 which is greater than the width of the longitudinal ends of the circulation ducts 5.

In this way, the circulation ducts 5 can be joined to fluidic connection portions 9, 109, for example in the form of pairs of half-shells 93, for example by brazing. The fluidic connection portions 9, 109 into which lead the ends of the circulation ducts 5 can be assembled with the hollow connectors 11 so as to form a heat transfer fluid manifold 7, 107 according to one or other of the embodiments.

This operation can be done for the two heat transfer fluid manifolds 7, 107 so as to form the thermal regulation device 1, 101. The heat transfer fluid manifolds 7, 107 obtained by assembling the fluidic connection portions 9, 109 with the hollow connectors 11 can be the same regardless of the dimensions, notably the thickness, the configuration, the number, of electronic components 3 to be thermally regulated.

This assembly can be done such that the circulation ducts 5 are advantageously spaced apart along the stacking axis A1, at a predefined spacing, which can be standard. So as to allow the insertion of the electronic components 3 to be thermally regulated, this predefined spacing is greater than the dimension of these electronic components 3 along the stacking axis A1.

The end sections 111 of the hollow connectors 11 can slide inside the complementing collars 95 until they reach the first position P1 or another, intermediate position between the terminal positions P1 and P2. The hollow connectors slide toward the outside of the fluidic connection portions 9, 109, toward the outside of the space for the flow of the heat transfer fluid defined between two half-shells 93 of a pair, for example. Before compression, the heat transfer fluid manifold 7, 107 is in an extended position, or even a position of maximum extent.

The thermal regulation device 1, 101 can for example be delivered to an end client, such as an automotive manufacturer, before assembly with the electronic components 3 to be thermally regulated.

Then, the electronic components 3 can be inserted simultaneously, or alternatively one by one, between the circulation ducts 5.

Subsequently, the assembly can be compressed along the stacking axis A1, preferably from the two sides of the device 1, 101, on account of the flexibility of the heat transfer fluid manifolds 7, 107, by causing the end sections 111 of the connectors 11 to slide in the associated collars 95. This time, the end sections 111 slide toward the inside of the fluidic connection portions 9, 109, toward the inside of the space for the flow of the heat transfer fluid defined between two half-shells 93 of a pair, for example.

The end sections 111 of the hollow connectors 11 can slide inside the complementing collars 95 before reaching the second position P2. The heat transfer fluid manifold 7, 107 is in a compressed state; in other words, the fluidic connection portions 9, 109 are tightened up, moved closer to one another, with respect to the extended position or position of maximum extent.

This compression ensures that the electronic components 3 are kept in position between the circulation ducts 5 and makes it possible to ensure the thermal contact necessary for the thermal regulation, such as the cooling. This makes it possible to dispense with or to reduce the amount of a thermal interface, such as a thermal paste, between the electronic components 3 to be cooled and the circulation ducts 5. However, a thermal interface (not depicted) can possibly be provided between the electronic components 3 and the circulation ducts 5.

Lastly, in addition to the compression of the assembly after the electronic components 3 have been inserted between the circulation ducts 5, the peripheral edge of the fluidic connection portions 9, 109 delimiting the opening into which leads the end of the corresponding circulation duct 5 can form the end stop for the electronic components 3 along the transverse axis A2.

The thermal regulation device 1, 101 thus assembled with electronic components 3 to be thermally regulated forms a module, such as a battery module, for a motor vehicle, in particular an electric or hybrid motor vehicle.

What is claimed is:

1. A device for thermally regulating at least one electronic component, said device comprising:
    at least two circulation ducts for a heat transfer fluid which are arranged along a stacking axis; and
    at least two heat transfer fluid manifolds in fluidic communication with the at least two circulation ducts and attached at opposite ends of the at least two circulation ducts to provide "I"-shaped fluid circulation between the at least two heat transfer fluid manifolds,
    wherein each of said at least two heat transfer fluid manifolds has;
        at least two fluidic connection portions respectively assembled at one end of a corresponding circulation duct and respectively having at least one collar bordering an orifice, and
        at least one hollow connector interposed between the at least two fluidic connection portions along the stacking axis, and having two opposite end sections mounted so as to be able to slide inside the collars of the at least two facing fluidic connection portions.

2. The device as claimed in claim 1, wherein each hollow connector has a cylindrical overall shape, with a central portion having a first external diameter and the end sections having a second external diameter greater than the first external diameter.

3. The device as claimed in claim 2, wherein the second external diameter of the end sections is equal to or greater than an internal diameter of each collar.

4. The device as claimed in claim 1, wherein said at least one collar of one fluidic connection portion of the at least two fluidic connection portions extends toward a neighboring fluidic connection portion of the at least two fluidic connection portions along the stacking axis.

5. The device as claimed in claim 1, having a predefined number of half-shells assembled in pairs at the opposite ends of the associated at least two circulation ducts, so as to define the at least two fluidic connection portions of each of said at least two heat transfer fluid manifolds, and wherein said at least one hollow connector is arranged between two pairs of half-shells.

6. The device as claimed in claim 1, wherein the at least two fluidic connection portions are made from a first material and each hollow connector includes at least one second, compressible material, the first material having a greater stiffness than said at least one second material.

7. The device as claimed in claim 1, wherein each hollow connector is arranged centrally with respect to the ends of the at least two circulation ducts.

8. The device as claimed in claim 1, wherein each hollow connector is arranged eccentrically with respect to the ends of the at least two circulation ducts.

9. The device as claimed in claim 1, wherein each hollow connector is made by overmolding an insert.

10. The device as claimed in claim 1, wherein each of said at least two heat transfer fluid manifolds has at least one end stop for said at least one electronic component along an axis transverse to the stacking axis.

* * * * *